United States Patent
Eguchi

(10) Patent No.: US 6,495,989 B1
(45) Date of Patent: Dec. 17, 2002

(54) BATTERY CONTROL APPARATUS AND MANAGEMENT METHOD OF BATTERY

(75) Inventor: Yasuhito Eguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 46 days.

(21) Appl. No.: 09/639,000

(22) Filed: Aug. 14, 2000

(30) Foreign Application Priority Data

Aug. 18, 1999 (JP) .......................................... 11-231283

(51) Int. Cl.[7] .................................................. H02J 7/00
(52) U.S. Cl. ...................................... 320/132; 320/130
(58) Field of Search .............................. 320/132, 130, 320/134, 137, 149, 159, 160; 324/427, 428

(56) References Cited

U.S. PATENT DOCUMENTS

| | | | | |
|---|---|---|---|---|
| 4,994,728 A | * | 2/1991 | Sasaki | 320/132 |
| 5,576,608 A | * | 11/1996 | Nagai et al. | 320/159 |
| 5,614,804 A | | 3/1997 | Kayano et al. | 320/134 |
| 6,054,861 A | * | 4/2000 | Takahashi | 324/428 |

* cited by examiner

*Primary Examiner*—Edward H. Tso
*Assistant Examiner*—Lawrence Luk
(74) *Attorney, Agent, or Firm*—Frommer Lawrence & Haug LLP; William S. Frommer; Bruno Polito

(57) ABSTRACT

A battery control apparatus of this invention comprises charge detecting circuit for detecting change of charge of a battery based on current of the battery, first residual charge amount detecting circuit coupled to the charge detecting circuit for detecting a first residual charge amount of the battery by compensating a predetermined reference residual charge amount based on the detected result of the change of charge of the battery. The battery control apparatus further comprises second residual charge amount detecting circuit for detecting a second residual charge amount of the battery based on al terminal voltage of the battery and reference residual charge amount updating circuit for updating the reference residual charge amount by detected result of the second residual charge amount of the battery, wherein the second residual charge amount of the battery is detected at a predetermined timing where the current of the battery is zero or almost zero.

13 Claims, 6 Drawing Sheets

BATTERY CONTROL APPARATUS AND MANAGEMENT METHOD OF BATTERY

BACKGROUND OF THE INVENTION

1. Field of the Invention

This invention relates to a battery control apparatus and management method of a battery, and particularly to such apparatus or method having function to check residual amount of battery power. For example, this invention is applicable to an electric bicycle, a personal computer, a portable telephone or the like, and the residual amount of battery power is detected based on both integrating current and terminal voltage of the battery.

2. Description of the Related Art

Many apparatus powered by a battery usually have a function to detect a residual amount of battery power left in the battery. Detection of the residual amount of battery power improves convenience of the battery-powered apparatus. As well known, a current integration method or a terminal voltage method is used for detection of the residual amount of battery power.

In the current integration :method, a full charge capacity or a residual capacity after the end of discharge is revised by a charge and discharge power of the battery obtained by integrating charge and discharge current. In this current integration method, detection precision of the residual amount of battery power is deteriorated, because detection error of charge and discharge current is accumulated by repetition of charging and discharging operation. Accordingly in order to improve detection precision, not only detection precision of a charge and discharge current is raised but also at a full charge or the end of discharge, the residual amount of detected battery power is reset by such as full charge capacities.

However, in the detection of the charge and discharge current, there is a problem that discharge current changes according to an operating condition of the connected various devices. Namely 1 [mA] degree of error may occur for a charge and discharge current of 10 [A] even if a charge and discharge current is measured by enough measurement precision.

In the current integration method, the residual amount of battery power detected by full charge capacities is reset at full charge or at the end of discharge, detection error of such charge and discharge current can be canceled. However, error is accumulated by the residual amount of detected battery power, and detection precision falls. if charging and discharging is repeated within a range that the battery does not reach to the end of discharge or a full charge. Even if a detection result that the power of the battery is still left is obtained in the current integration method, there is the case that the detected power actually can not be used for driving an apparatus. In this case where the current integration method is applied for detecting the residual amount of battery power, the battery suddenly goes down.

On the contrary, the voltage method detects the residual amount of battery power based on the relation between terminal voltage of the battery and the residual amount of battery lower (accumulated electricity amount). In other words when the battery discharges electricity with constant discharge current, the terminal voltage gradually goes down by about constant property as shown in FIG. 6. Accordingly the residual amount of battery power can be detected by measuring the terminal voltage of the battery.

Property of the relation between the terminal voltage and the residual amount of battery power 'shows the residual electricity amount based on the full charge power. The characteristics of relation between residual amount and terminal voltage of the battery shows charging capacity of residual amount based on the full charging power. Thereby if the ratio (accumulated electricity amount%) of the residual amount relative to full charging power is used, one characteristic curve can be applied to various kinds of batteries in spite of volume of full charging capacity. In case of this method, the operation processing using a full charge capacity value is necessary for detection of the residual amount of battery power.

In case of this method, accumulation of error does not occurs like as a case by the current integration, method. Furthermore, error becomes small as it becomes near the end of discharge in case of this voltage method. Accordingly sudden battery shortage as a case by the current integration method can be reduced.

By the way, the terminal voltage of the battery varies with internal resistance according to the charge:, and discharge current. Accordingly in the case of the voltage method, it is necessary to revise detected terminal voltage according to the charge and discharge current in order to apply to this characteristic curve. If the temperature is high, the internal resistance becomes low and if the temperature is low, the internal resistance becomes high. Namely, the internal resistance varies with temperature within a range of several times. Accordingly, in case of this voltage method, error in the detected residual amount of battery power becomes large only if charge and discharge current is large. In addition, if temperature is low, the error in the detected residual amount of battery power becomes large. Accordingly, in the voltage method, there is the problem that precision is not so good.

As a method of one solving this problem, the property between the terminal voltage and the residual amount of battery power is recorded at various charge and discharge current, and the residual amount of battery power is detected corresponding charge and discharge current. In case of this method, there is the problem that a construction becomes complicated in order to record various kinds of curves.

In addition, the terminal voltage of the battery does not follow with a sudden change of charge and discharge current, and it takes several minutes to several ten minutes until the terminal voltage is finally settled down to the terminal voltage corresponding to the charge and discharge .current. In other words when the supply of power is stopped, for example, and discharge current becomes 0 [A], relatively long time is necessary for the terminal voltage to be a value of no-load status corresponding to 0 [A] of discharge current.

Therefore, when the residual amount of battery power is detected with voltage method, there is a problem to fall detection precision of residual amount of battery power when residual amount of battery power is detected by such transient time of the terminal voltage.

A change of such terminal voltage of the battery is based on polarization reaction or something like that occurred in inside of the battery. The time interval for the terminal voltage to be constant upon changing charge and discharge cur rent varies depending on charging and discharging current up to that time and also depending on temperature.

FIG. 7 is a characteristic curve showing change of the terminal voltage. The change of the terminal voltage after stopping the power supply with the same discharge current at the time point t1 is shown. As shown by a curve A, it takes long time for the terminal voltage to be constant when the power is supplied for long hours. On the other hand when a power is supplied to the battery for short hours, it takes short time for the terminal voltage to be constant as shown by a curve C in FIG. 7. A change of terminal voltage shown by a curve B is the case where a power is supplied to the battery for an intermediate time.

SUMMARY OF THE INVENTION

In order to overcome above defects, a residual charge amount detected by the current integration method is compensated by a residual charge amount detected by the voltage method according to the present invention.

Namely, in accordance with the present invention, a battery control apparatus comprises charge detecting means for detecting change of charge of a battery based on current of the battery, first residual charge amount detecting means coupled to the charge detecting means for detecting a first residual charge amount of the battery by compensating a predetermined reference residual charge amount based on the detected result of the change of charge of the battery, second residual charge amount detecting means for detecting a second residual charge amount of the battery based on a terminal voltage of the battery, and reference residual charge amount updating means for updating the reference residual charge amount by detected result of the second residual charge amount of the battery, wherein the second residual charge amount of the battery is detected at a predetermined timing where the current of the battery is zero or almost zero.

In the battery control apparatus of the present invention, the battery control apparatus is connected to an external device as to form a path for the current between the external device, and the reference residual charge amount updating means generates the predetermined timing by designating the interruption of the current of the battery to the external device.

In the battery control apparatus of this invention, wherein the battery control apparatus includes the battery, and the battery control apparatus is powered by the battery.

Further in the battery control apparatus of this invention, wherein the battery is detachably mounted on the battery control apparatus, and the battery control apparatus is powered by the battery.

In the battery control apparatus of this invention, wherein the current of the battery is charging current of the battery or discharging current of the battery.

This invention further relates to a management method for a battery, comprising the steps of detecting an intermediate residual charge amount of a battery based on a terminal voltage of the battery during the time when current of the battery is almost zero, and detecting a final residual charge amount of the battery based on current of the battery by setting the intermediate residual amount of the battery as a reference.

Further in a management method for a battery of this invention, wherein a predetermined time is set to a time interval where the time that current of the battery is almost zero elapses, and the predetermined time is an interval where changes of the terminal voltage of the battery become stable.

DETAILED DESCRIPTION OF THE PREFERRED EMBODIMENT

Various embodiments of the present invention are explained in detail with reference to drawings attached hereto as follows.

(1) The First Embodiment

Figure 2:
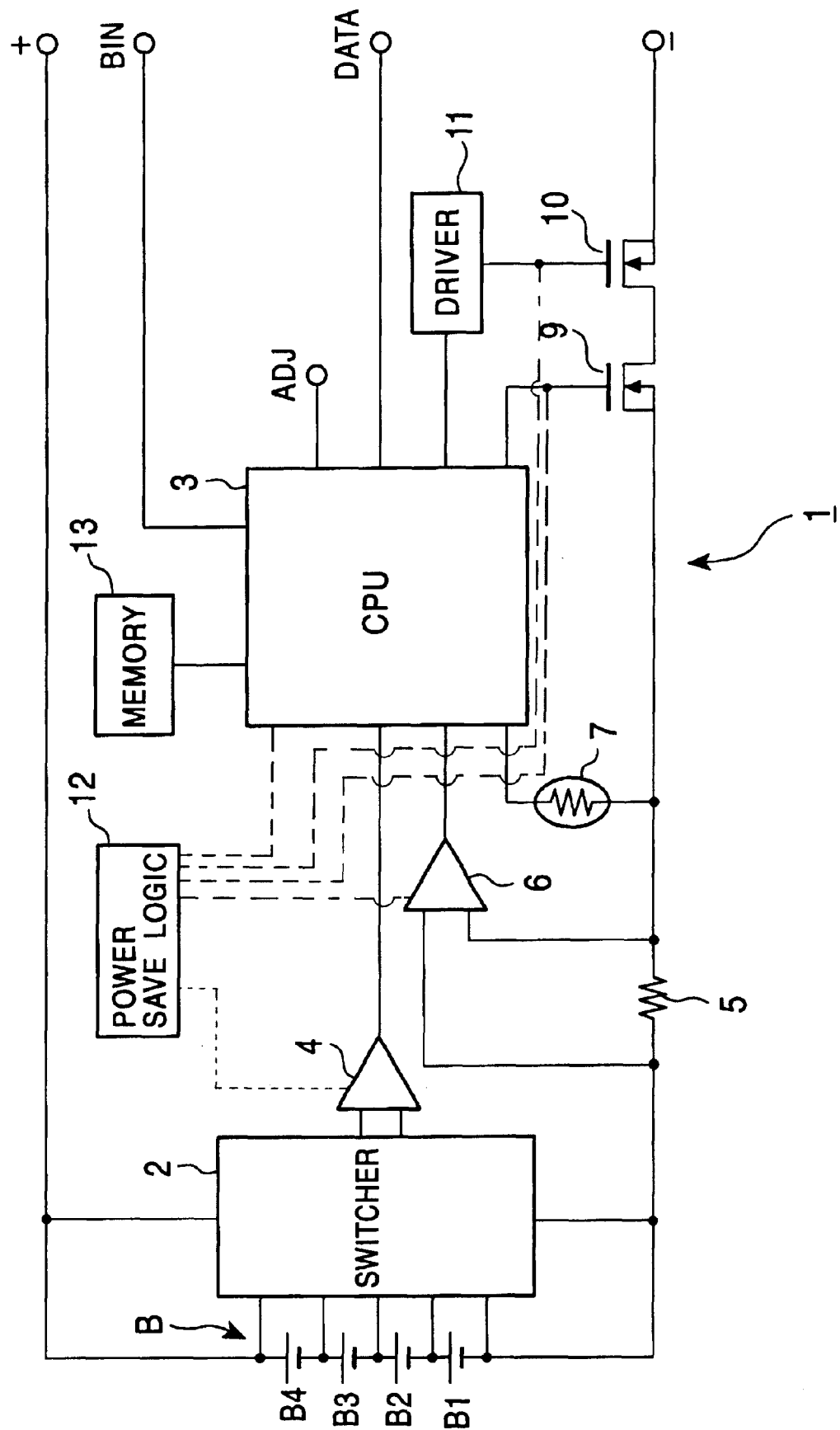
FIG. 2 is a block diagram showing a battery pack of the first embodiment of this invention.

FIG. 2 shows a block diagram of a battery pack 1 in accordance with the first embodiment of this invention. This battery pack 1 is connected to a predetermined external device so as to form a current path between the battery B and the external device. In case where the battery charging apparatus is connected to the battery B as the external device, charging current is supplied from the battery charging apparatus to the battery B. In case where a personal computer or the like is connected as the external device, discharging current (operation current for the external device) is supplied from the battery B to the personal computer or the like.

On this account this battery pack 1 is installed in a case of predetermined shape, and there are provided an input-output terminal +and −, a control terminal BIN for accepting designation of the power supply, a mode change terminal ADJ for changing operation mode of the battery pack 1 into a calibration mode and a data communication terminal DATA for exchanging various data on this case.

The battery B has series connected four battery cells B1~B4 and connected to the input-output terminal +and −. Accordingly the battery B is supplied charging current or supplies discharging current by way of this input-output terminal +and −. In this embodiment, the battery cells B1~B4 are preferably lithium-ion type battery cells.

A switcher 2 connects both end terminals of each battery cells B1~B4 to an amplifier 4 by the control of a central processing unit (CPU) 3. The amplifier 4 detects the terminal voltages of each cell, and transfers this result to the central processing unit 3. The central processing unit 3 controls the charging and discharging of the battery cells B1~B4 based on the terminal voltages thus supplied and further detects the residual power of the battery B.

A detection resister 5 is inserted in a cold side of the charge and discharge current path, and the terminal potential across the detection resister 5 changes according to charge and discharge current. Further an amplifier 6 detects the terminal potential of this detection resistance 5, and supplies it to the central processing unit 3. Accordingly, the central processing unit 3 is able to detect charge and discharge current of the battery B.

A temperature detection element 7 is constituted by a thermistor, for example, and the temperature detection element 7 is connected to the central processing unit 3, change of the resistance value is detected by the central processing unit 3. Temperature of the battery B can be detected by the central processing unit 3, and thus detected temperature is used for compensating the residual amount of battery power and for detecting abnormal operation of the battery cells B1~B4.

A discharge control FET 9 and a charge control FET 10 are inserted in series to a charge and discharge current pass in the cold side. The central processing unit 3 changes the operation of these FET 9 and FET 10, stops the supply of charging current to the battery B and discharge current from the battery B.

A driver 11 compensates the difference of ground level between the discharge control FET 9 and the charge control FET 10 by correcting direct current level of the control signal of the charging FET 10 issued from the central processing unit 3.

When a request of the power supply to the battery B is not input from the external device by the monitor of the control terminal BIN, a power save logic 12 changes the operation mode of the battery pack 1 to power-saving mode, and the power consumption of the battery B is reduced by this. The power save logic 12 stops the supply of power to the amplifiers 4 and 6 in this power-saving mode. The power consumption of the battery B by the amplifiers 4 and 6 is prevented by this. In addition, the operation mode of the central processing unit 3 is changed into sleep mode, and power consumption of the battery B by the central processing unit 3 is reduced by this. In addition, by the sleep mode of this central processing unit 3, the discharge control FET 9 and the. charge control FET 10 are set to off condition. Even feeble discharge current is not supplied to the external device in this off condition.

When the residual amount detection processing of battery power is executed by the central processing unit 3, the power save logic 12 changes the operation mode into the power-saving mode when the central processing unit 3 ends this processing routine.

A memory 13 is a nonvolatile memory and constituted by E2PROM (electrically erasable programmable read only memory), for example. The memory 13 stores data for calibration such as data of the terminal voltage detected through the amplifier 4, data of discharge current detected through the amplifier 6 and data of temperature detected through the temperature detection element 7. These data for this calibration are used to correct these detection results in order to improve the detection precision of the terminal voltage.

Figure 7:
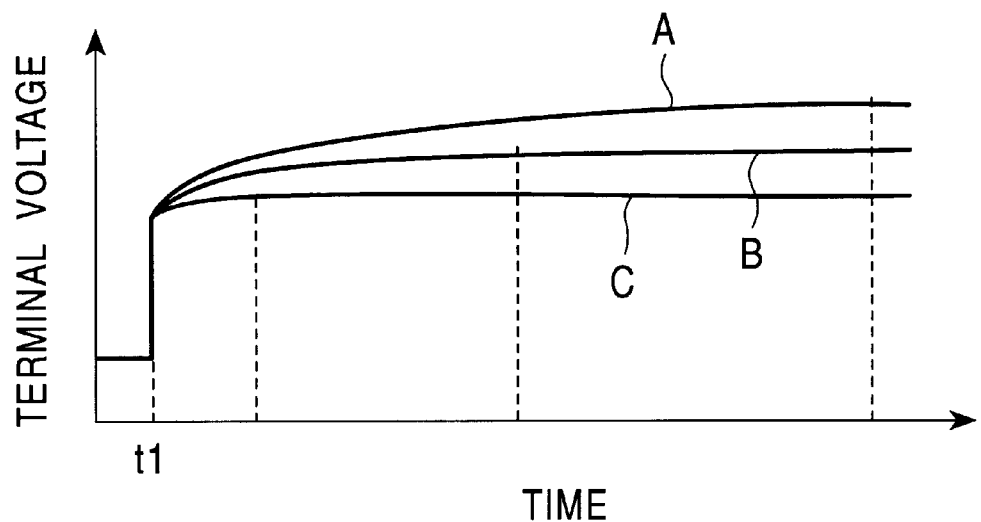
FIG. 7 is a characteristic curve showing change of the terminal voltage of the battery.

Furthermore, the memory 13 stores data for the terminal voltage versus the charging amount as explained in FIG. 7. In this embodiment, as the data for the terminal voltage versus the charging amount, the data for the terminal voltage versus the charging amount at a predetermined temperature when there is no load is used. Furthermore, the memory 13 stores correction data for compensating the data for the terminal voltage versus the charging amount based on the temperature.

For example, the memory 13 stores these data by the control of the central processing unit 3 at an adjustment manufacturing process in plant shipment or at a predetermined maintenance. In addition, the memory 13 supplies these data to the central processing unit 3 by the control of the central processing unit 3 in an usual operation mode.

The central processing unit 3 constitutes a controller for controlling the operation of this battery pack 11. When the mode change terminal ADJ is raised, the central processing unit 3 executes a predetermined processing program stored in the external device by way of the data communication terminal DATA. In this case, the central processing unit 3 detects the terminal voltage of the battery cells B1~B4, charging current and temperature of the battery cells B1~B4, and these detection results are output through the data communication terminal DATA. The central processing unit 3 further executes an analog to digital conversion processes for the output voltage of the amplifiers 4 and 6 by a built-in analog to digital conversion circuitry, and detects the terminal voltage of the battery cells B1~B4 and the charging current. In addition, the temperature of the battery cells B1~B4 is also detected by detecting the terminal voltage with temperature detection element 7 operating in a constant current drive mode.

Furthermore, the central processing unit 3 supplies these data for calibration obtained by analyzing the external device through the data communication terminal DATA and stores the data for calibration in the memory 13. Further the central processing unit 3 is supplied a correction data for temperature of terminal the voltage versus residual amount together with the data for calibration and stores these data in the memory 13.

Figure 1:
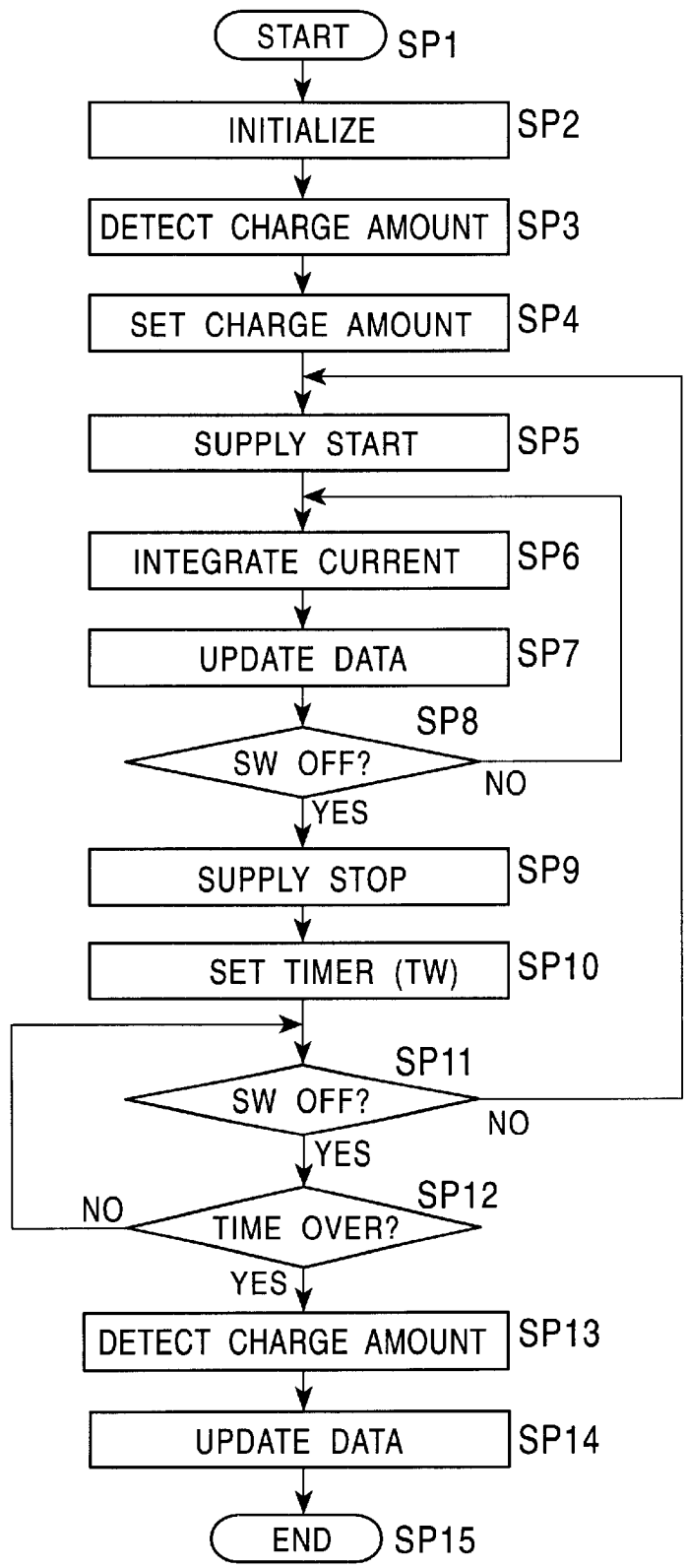
FIG. 1 is a flowchart showing a processing routine of a central processing unit of the first embodiment of this invention.

Furthermore, when the voltage of the control terminal BIN is pulled up to the voltage (the voltage of the input-output terminal +) of the power line, the central processing unit 3 starts to execute the residual amount detection processing routine of battery power as shown in FIG. 1. In this processing routine, the central processing unit 3 compensates the terminal voltage of the battery cells B1~B4 detected through the amplifier 4, the discharge current detected through the amplifier 6 and the temperature detected through the temperature detection element 7 with the data for calibration stored in the memory 13.

In other words the central processing unit 3 moves the processing from step SP1 to step SP2 when the voltage of the control terminal BIN is raised. The central processing unlit 3 becomes the usual operation mode from the sleep mode by the control of the power save logic 12 and executes the initialization while keeping the discharge control FET 9 and the charge control FET 10 in off condition. Usually the terminal BIN is raised by the operation of power switch of the external device.

The central processing unit 3 then moves the processing to Step SP3 and detects the terminal voltage of the battery cells B1 B4 in no-load by controlling the operation of the switcher 2. Furthermore, the central processing unit 3 accesses the data for the terminal voltage versus charge amount stored in the memory 13, and the charging amount corresponding to this detected terminal voltage is detected. In this case the central processing unit 3 compensates the charging amount with the data for calibration stored in the memory 13 according to the temperature detected through the temperature detection element 7.

The central processing unit 3 moves the processing to step SP4 and stores the charge amount detected at the step SP3 as a reference residual amount of the battery B to a built-in capacity register. Then the central processing unit 3 moves the processing to step SP5 and makes the discharge control FET 9 and the charge control FET 10 to ON state. Thereby when the request of the power supply is input from the external device, the central processing unit 3 starts the supply of power to the external device after detection of the residual amount of the battery B with reference to the terminal voltage of no-load condition.

Then the central processing unit 3 detects the capacity detection result based on the terminal voltage of the battery together with the switcher 2 and the amplifier 4. This capacity detection result constitutes reference residual amount revision means for updating the reference residual amount. In addition, the discharge control FET 9 and the charge control FET 10 constitute switching circuits intercepting current of the battery. In this battery pack 1, the predetermined timing to update the reference residual amount is set at the timing just before the current of the battery starts to flow. Further the update timing is set in the period where the current of the battery is zero by the control of the discharge control FET 9 and the charge control FET 10.

When the supply of power is started, the central processing unit 3 moves the processing from step SP5 to step SP6 and calculates the power supplied to the external device by integrating the discharge current within a predetermined interval. Thereby the central processing unit 3 constitutes a power detection means for detecting a power change of the battery based on the current of the battery together with the detection resistance 5 and the amplifier 6.

The central processing unit 3 moves the processing to step SP7, and the consumed charge amount is obtained by dividing detected power at step SP6 by the full charge volume of the battery B. Then the central processing unit 3 subtracts the consumed charge amount from the reference residual amount stored in the built-in capacity register. Thereby the central processing unit 3 updates the reference residual amount of the capacity register by this subtraction result. Accordingly the central processing unit 3 constitutes the residual amount detection means for detecting the residual amount of battery power, in which the residual amount detection means revises the reference residual amount by the detection result from the power detection means.

The central processing unit 3 then moves the processing to step SP8 and judges whether the control terminal BIN is raised. When a negation result is provided here, the processing returns to the step SP6. Thereby in the central processing unit 3, after started the supply of power, the residual amount of battery power is calculated by the current integration method with reference to the residual amount of battery power done by the voltage method in the terminal voltage of no-load.

On the contrary the control terminal BIN goes down, an affirmation result is provided in step SP8 and the central processing unit 3 moves the processing to step SP9 from the step SP8. The central processing unit 3 sets the discharge control FET 9 and the charge control FET 10 in off condition and stops the power supply to the external device.

The central processing unit 3 moves the processing to step SP10 successively, sets a timer for measuring halt period of power supply and starts to measure about elapsed time of this period.

Then the central processing unit 3 judges whether the control terminal BIN is kept raised in step SP11, namely whether the designation from the external device detected at the step SP9 is continued. When a negation result is provided here, the central processing unit 3 returns the processing to the step SP6. On the contrary when an affirmation result is provided in step SP1, the central processing unit 3 moves the processing to step SP12, and judges whether al time set at the step SP10 exceeds the predetermined time. When the measurement time with this timer does not reach the predetermined time TW, the central processing unit 3 returns the processing to the step SP11.

On the contrary, after stopping the supply of power to the external device, the predetermined time TW is passed and an affirmation result is provided in step SP12, then the central processing unit 3 moves the processing to step SP13. The central processing unit 3 detects the residual amount of power of the battery B with reference to the data for voltage versus charging amount stored in the memory 13 and updates the reference residual amount stored in the capacity register with thus obtained the residual amount of power as explained at the step SP3.

When the supply of power is started after the central processing unit 3 stopped by the supply of power to the external device before the predetermined time TW does not pass, the residual amount stored in the capacity register is used as a reference, and the residual amount of battery power is calculated by the current integration method. On the other hand the central processing unit 3 detects the residual amount of battery power from the beginning with reference to the terminal voltage of no-load by the voltage method when predetermined time TW passed.

This predetermined time TW is set corresponding to a time interval Tp (it is called a relaxation time) where the terminal voltage of battery cells B1~B4 become stable after stopping the power supply to the external device. And this predetermined time TW is set according to the system to which this battery pack 1 is applied because the residual amount of battery power can be detected based on the data for voltage versus charge amount stored in the memory 13 by enough precision.

The relaxation time Tp varies with a kind of the battery cell, temperature, current and a DOD. The DOD represents ratios of a charge mount at present time with reference to the full charge capacity. For example, when 200 [mAh] of charge is discharged from the full charge status (a amount of charge amount is 1000 [mAh]), the DOD is 20 [%] and residual amount is 800 [mAh], and the DOD is 50 [%] when 500 [mAh] of charge is discharged.

In some external device, on and off of the power is executed by short time interval. In such a case, the predetermined time TW is set in comparatively short time, and the detection result of the residual amount of battery power is thought to be reflected by the change of the residual amount of battery power by on and off of power. In addition, in the external system where the on and off of power is not frequent and off state is relatively long, the predetermined time TW is thought to be set to the expected longest off interval. The predetermined time TW is set for around dozens of minutes in a case with lithium-ion battery is used and the residual amount of battery power by enough precision is achieved. In case of this embodiment, the predetermined time TW is set to 30 minutes.

Thereby the central processing unit 3 detects the residual amount by the voltage method when the period where current does not flow in the battery continues more than predetermined time and if this period is enough for the change of the terminal voltage of the battery to be stable.

Thus the central processing unit 3 executes again the detection of residual amount, then the central processing unit 3 moves the processing to step SP14 to execute correction processing of the full charge capacity. After that the central processing unit 3 moves the processing to step SP 15 to quit. Thereby in the case when the central processing unit 3 detects the residual amount with no-load condition at step SP3, the residual amount can be detected at the time when more than predetermined time TW passed after stopping the supply of electricity.

Thereby the amount of accumulation of electricity S [%] detected at step SP3 and the amount of accumulation of electricity E [%] detected at step SP13 by the central processing unit 3 are the measurement result that does not receive influence of polarization in the battery cells B1~B4, and shows the residual amount of battery B by high precision.

Thereby the relation between a total current integration value CC [Ah] detected by repeating step SP6 and a full charge capacity FC [Ah] are expressed by a following formula.

$$FCx(S\%=E\%)/100 \qquad 1$$

However, in the full charge capacity FC, there is the case that actual survey value differs from a catalog value. In addition, there is the case that a real value differs from a value recorded in the memory 13 by degradation of the battery cells B1~B4. In this case, sometimes the above relational expression 1 is not applied.

The central processing unit 3 updates the full charge capacity recorded in the memory 13 in step SP 14 because of this reason. In other words in the processing routine shown in FIG. 1 the central processing unit 3 utilizes an accumulated electricity volume S%, accumulated electricity volume E% and a total integration value CC Ah respectively obtained at step SP13 and SP14 to the above expression 1 for calculating the full charge capacity FCc, where the FCc= 100×CC/(S%−E%).

Furthermore, the central processing unit 3 subtracts this full charge capacity FCc from the full charge capacity FCo stored in the memory 13 till then, and a differential value ΔFC of the full charge capacity (=Fco −FCc) is calculated. Namely, the central processing unit 3 calculates the full charge capacity FCx by an operation processing of next formula using this differential value ΔFC.

$$FCx=Fco-\Delta FC/n \qquad 2$$

The central processing unit 3 updates the full charge capacity stored in the memory 13 by the full charge capacity FCx detected by an operation processing of this expression 2 then moves the processing to step SP15 to quit this processing routine. Here the value n is a constant to prevent false updating of the full charge capacity. And the value n is set to relatively large value when the temperature is extremely low, the temperature is extremely high, the total current integration value CC [Ah] is small or the differential value ΔFC of a full charge capacity is big. In these cases, it is expected that the error included pin the differential value ΔFC of the full charge capacity detected by numeration stated above becomes large and that the measurement precision is not so good.

The central processing unit 3 repots to the external device thus detected residual amount of battery power according to the request of the external device through the data communication terminal DATA. In this case the central processing unit 3 calculates the residual amount of battery power by correction of electricity volume stored in the capacity register with the full charge capacity, and then reports to the external device. It can be confirmed the residual amount of battery B in the external device using power of the battery B in the battery pack 1. In addition, it is done to notify a user the residual amount of the battery power through a predetermined display means.

The central processing unit 3 watches the terminal voltage of the battery cells B1~B4, a charge and discharge current and the temperature of the battery cells B1~B4 in a processing of such a serial processing routine and charge as described above and thereby over-charge and over-discharge of the battery B is avoided. In addition, If something abnormal state is detected, the central processing unit 3 switches the discharge control FET 9 and the charge control FET 10 to be off and stops the charging operation and the discharging operation.

In the above described construction, the battery pack 1 in FIG. 1 is connected to an external device. If the external device is a battery charger, the battery cells B1~B4 are charged by charging current supplied by way of the input-output terminal +and −.

On the contrary when the external device is a battery-powered device and when the potential of the control terminal BIN is raised (FIG. 1) by the operation of a power switch of the battery-powered device, the terminal voltage of battery cells B1~B4 is detected while keeping the discharging FET 9 and charging FET 10 to be off. Further the residual amount directed by the terminal voltage based on the data for terminal voltage versus charge amount stored in the memory 13 is detected. The residual amount of battery power is detected by the status that current does not flow in the battery B in the battery pack 1 by this voltage method. In the terminal voltage, the residual amount of battery power can be detected with no-load condition without receiving any influence by internal resistance. Accordingly the residual amount of the battery power can be detected with high precision.

When the residual amount of battery power is detected, the residual amount of this battery power is stored as a reference residual amount in the capacity register, then the supply of load current is started to the an external device. After the supply of load current is started, the power flowing out from the battery pack 1 is calculated by integration of load current, and the reference residual amount stored in the capacity register updated by this calculated power. Then the residual amount of the battery B is detected. In the detection of residual amount of this battery power, the detection is done without the influence of internal resistance in no-load condition, so that the residual amount of battery power can be detected more precision than a conventional method.

When the residual amount of battery power is detected by the current integration method, the battery pack 1 changes the discharge control FET 9 and the charge control FET 10 to off condition upon receiving the designation of halting the supply of power to the external device and the supply of power to the external device is controlled to stop. Then the measurement time when the supply of power is halted is started.

The supply of power is again started for the correspondence to this designation within the interval that does not pass more than interval TW necessary for the change of terminal voltage to be stable, the supply of power again started from the battery B. In addition, after the supply of power is started, the residual amount of the battery B is detected by the current integration method with reference to the reference voltage stored in the capacity register at a point of the supply of power in battery pack 1. Thereby the residual amount of the battery B can be detected by high precision compared with a conventional method in battery pack 1 by this.

On the contrary in the case when the interval passes more than the interval TW necessary for the change of terminal voltage to be stable, the battery pack 1 detects the terminal voltage of the battery cells B1~B4 of no-load status and accordingly the residual amount of the battery B is detected by voltage method. The residual amount of thus detected battery power is stored as a reference residual amount in the capacity register.

In this case, in the battery pack 1, the residual amount of battery power is detected by the status of the no-load and the detection does not receive influence of internal resistance. Accordingly the residual amount of battery power can be detected, by high precision compared with the conventional method. In additions, in this residual amount of battery power thus detected, the terminal voltage detected after a change of terminal voltage by a polarization calmed down is used as the reference. Accordingly the detection is more precision than when the terminal voltage is used as a reference by merely no-load.

Thus in the battery pack 1, the operation is down when the residual amount of battery power is detected by the voltage method with the terminal voltage in status of no-load. Thereby in the battery pack 1, when the residual amount of battery power is detected by the voltage method in response to the raised potential of the control terminal BIN, the residual amount of battery power is able to be detected with reference to the terminal voltage which is detect ed after a change of terminal voltage by a polarization is calm down. Furthermore, the residual amount of battery power can be detected by current integration method with reference to the residual amount of this battery power thus detected by the voltage method, and therefore the residual amount of battery power can be detected by higher precision compared with a conventional method by these more.

When the voltage method and the current integration method are put together for detecting the residual amount of battery power in the battery pack 1, the full charge capacity of the battery B is revised by the difference between the differential value of the residual amount of battery power detected with voltage method and the change of power detected by the current integration method. Thereby in the battery pack 1, degradation of the battery B can be detected and the residual amount of battery power can be detected by high precision in the detection of afterward for the correspondence to this degradation.

The correction value of the detected full charge capacity is revised in 1/n, and thereby the full charge, capacity is revised. Further when the temperature is extremely low, the temperature is extremely high or the total of the current integration value CC [Ah] is small, the full charge capacity is revised by increasing the value of this n. Thereby in the battery pack 1, false correction of the full charge capacity by noise is evaded effectively, and it is improved detection precision of the residual amount of the battery power by this.

(2) The Second Embodiment

Figure 3:
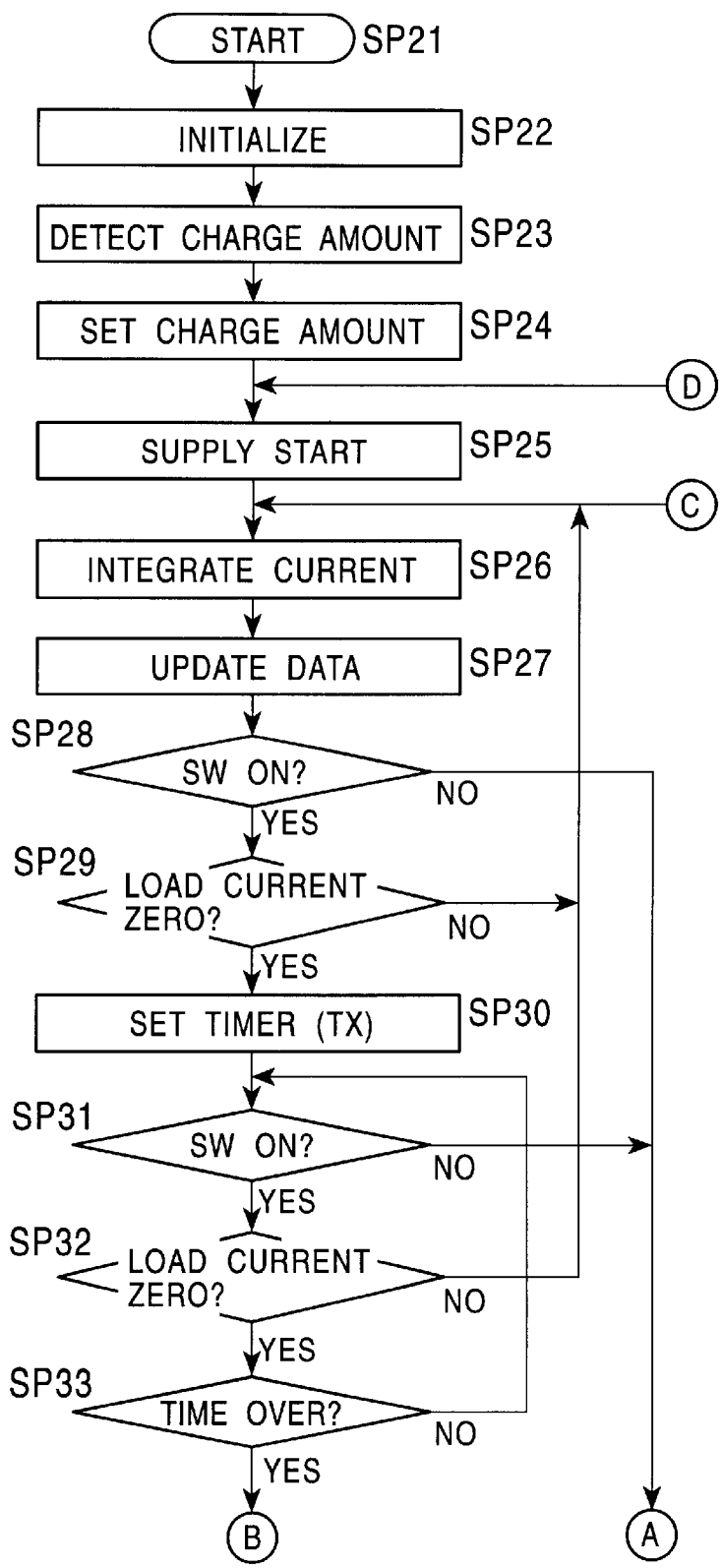
FIG. 3 is a flowchart showing a processing routine of a central processing unit of the second embodiment of this invention.
Figure 4:
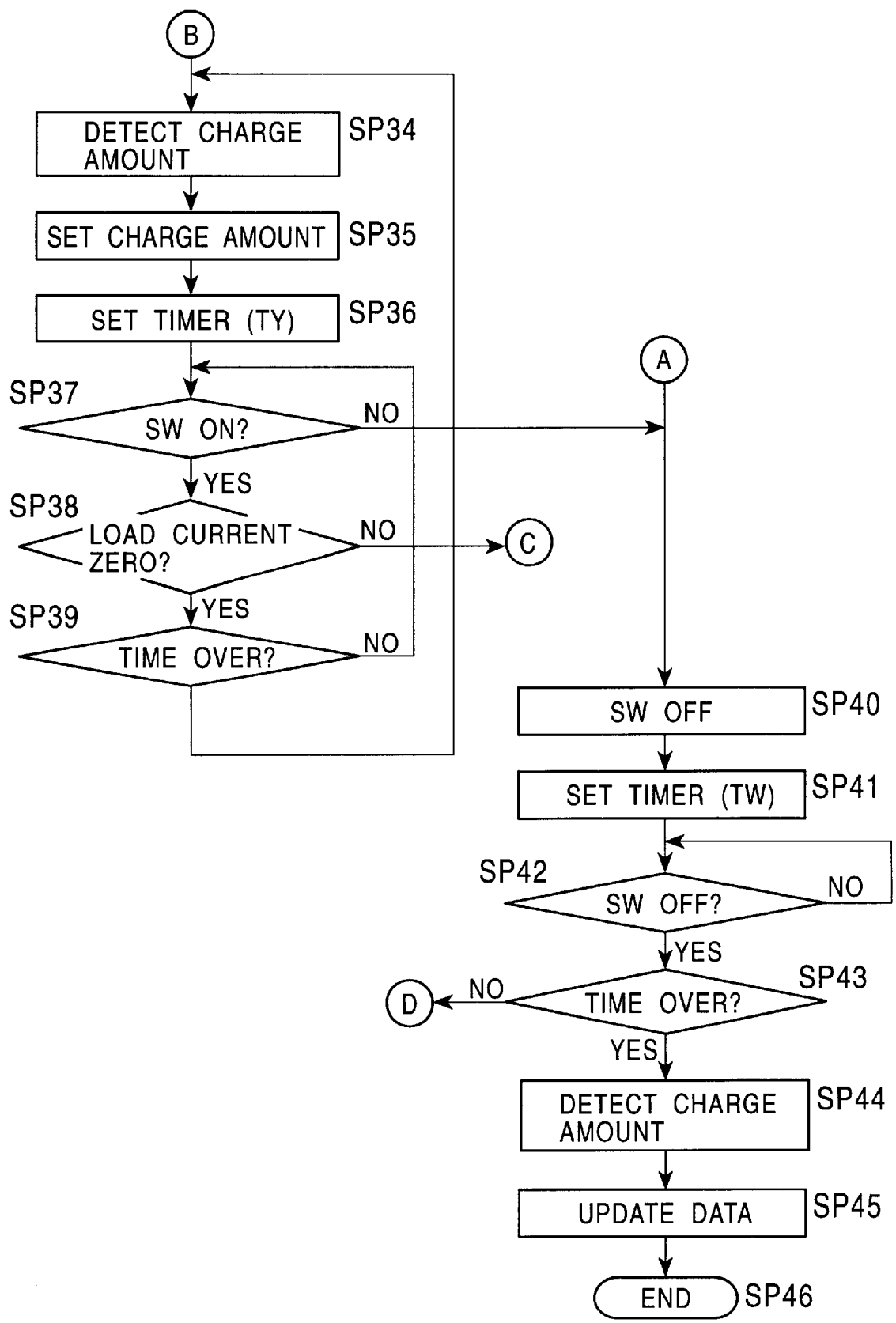
FIG. 4 is a flowchart showing a continuance of FIG. 3.

FIGS. 3 and 4 are flowcharts each showing a processing routine of a residual amount detection processing by this central processing unit of the battery pack in the second embodiment of this invention. The central processing unit in this embodiment consists of as same as central processing unit 3 in the first embodiment. Namely the central processing unit 3 executes a processing routine as shown in this FIG. 3 and FIG. 4 replacing with a processing routine as shown in FIG. 1. In addition, in the battery pack of this embodiment, a construction is as same as the construction of battery pack stated above in FIG. 2 except that a construction of a central processing unit is different. Accordingly FIG. 2 is explained using the same sign in the following discussion.

The battery pack of this second embodiment, this processing routine is executed in a case where the external device has almost zero load current interval even after the power is made on.

In other words the central processing unit moves the processing from step SP21 to step SP22 when the voltage of the control terminal BIN is raised. The central processing unit becomes usual operation mode from sleep mode by the control of the power save logic 12 and executes the initialization while keeping the discharge control FET 9 and the charge control FET 10 in off condition.

The central processing unit then moves the processing to step SP23 and detects the terminal voltage of the battery cells B1~B4 in no-load by controlling an operation of the switcher 2. Furthermore, the central processing unit accesses the data for terminal voltage versus charge amount stored in the memory 13, and the charging amount corresponding to this detected terminal voltage is detected. In this case the central processing unit compensates the charging amount with the data for calibration stored in the memory 13 according to the temperature detected through the temperature detection element 7.

The central processing unit moves the processing to step SP24 and stores the charge amount detected at the step SP23 as a reference residual amount of the battery B to a built-in capacity register. Then the central processing unit moves the processing to step SP25 and makes the discharge control FET 9 and the charge control FET 10 ON state. Thereby when the request of the power supply is input from the external device, the central processing unit starts the supply of power to the external device after detection of the residual amount of the battery B with reference to the terminal voltage of no-load condition.

When the supply of power is started, the central processing unit moves the processing from step SP25 to step SP26 and calculates the power supplied to the external device by integrating the discharge current within a predetermined interval.

The central processing unlit moves the processing to step SP27, and the consumed charge amount is obtained by dividing detected power at step SP26 by full charge volume of battery B. Then the central processing unit subtracts the consumed charge amount from the reference residual amount stored in the built-in capacity register.

The central processing unit then moves the processing to step SP28 and judges whether the control terminal BIN is raised. When an affirmation result is provided here, the processing goes to step SP29, and judges if the load current as the charge current is 0 [A] or not. When a negation result is provided here, the central processing unit returns the processing to the step SP26. Thereby in the central processing unit, after started the supply of power, in a case where the load current is not 0 [A], the residual amount of battery power is calculated by the current integration method with reference to the residual amount of battery power detected by the voltage method in the terminal voltage of no-load.

On the contrary an affirmation result is provided in step SP29, the central processing unit moves the processing to step SP30 from the step SP29 and sets the predetermined timer. Thereby the central processing unit starts to measure about elapsed time when the load current is kept 0 [A].

Then the central processing unit moves the processing to step SP31 and judges whether the control terminal BIN is kept raised. When an affirmation result is provided, the processing moves to step SP32. Here the central processing unit judges if the load current is 0 [A] and if an affirmation result is obtained, then the processing moves to the step SP26. Thereby after the load current is raised by the supply of the power and measurement of time when the load current is zero is started, then the residual amount of battery power is detected by the current integration method with reference to the reference residual amount stored in the .capacity register in this central processing unit.

On the contrary when the load current is kept 0 [A] even after the measurement of the time of the zero load current is started, an affirmation result is provided in step SP32. Thereby the central processing unit moves the processing to step SP 33. Then the central processing unit judges whether the time set at the step SP30 is over. The central processing unit judges the time over when the measured time elapses enough time for the change of the terminal voltage by a polarization to be stable and the measured time becomes the measurement time TX which is previously set.

Thereby a negation result is provided in this step SP33, the central processing unit returns the processing to the step SP 31, and the central processing unit detects the residual amount of battery power by the current integration method with reference to the residual amount stored in the capacity register.

On the contrary when an affirmation result is provided in the step SP33, the central processing unit, moves the processing to step SP34 (FIG. 3), and the residual amount of battery power is detected based on the data of voltage versus charge amount as same as done in the step SP23.

Then the central processing unit moves the processing to step SP35, and stores the charge amount detected at the step SP34 to the built-in capacity register as the reference residual amount of the battery B.

Even in the case where the power is able to supply to the external device during interval of no load becomes the time when the change of terminal voltage by a polarization becomes stable, the central processing unit detects the residual amount by the voltage method, and updates the reference residual amount of battery power. The detection precision of residual amount is done by this.

When the central processing unit detects the residual amount of battery power, the central processing unit moves the processing to step SP36, and starts the timer defining a residual amount detection cycle of battery power in no-load. Then the central processing unit moves the processing to step SP38 and judges whether the load current is 0 [A]. When a negation result is provided here. the processing returns to the step SP26. Thereby after the residual amount of battery power by the voltage method is done in the case where the load current 0 [A] lasts, the central processing unit detects the residual amount of battery power by the current integration method with reference to the residual amount of battery power detected by this voltage method after the load current starts to flow.

On the contrary when an affirmation result is provided in the step SP38, the central processing unit moves the processing to step SP39, and judges whether the time set at the step SP36 is over. When the measured time by the central processing unit becomes the measurement time TY previously set, it is judged that the time is over. When a negation result is provided here, the central processing unit moves the processing to step SP37. But when an affirmation result is provided here, the central processing unit returns the processing to the step SP34, and detects the residual amount of battery power by voltage method again.

Thereby the central processing unit detects residual amount of battery power by the voltage method with the constant time interval when the load current is 0 [A], and after the predetermined time where the time of zero load current. Thereby the central processing unit improves the detection precision of residual amount of battery power by this.

On the contrary when the control terminal BIN goes down in this serial processing, the central processing unit can get a negation result in the step SP28, the step SP31 or the step SP37. In these cases the central processing unit moves the processing to step SP40, and stops the power supply to the external device by setting the discharge control FET 9 and the charge control FET 10 to off condition.

Then the central processing unit moves the processing to step SP41, and starts to measure a time of al halt period of the power supply by setting a timer to measure a halt period of the power supply.

After that the central processing unit judges in step SP42 whether the control terminal BIN is kept lowered. When a negation result is provided here, the central processing unit returns the processing to the step SP 26.

On the contrary when an affirmation result is provided in the step SP42, the central processing unit moves the processing to step SP43, and judges whether a time set at the step SP41 is over. The central processing unit returns the processing to the step SP42 when the measurement time by this timer does not reach the predetermined time TW.

On the contrary in the case where the predetermined time TW is over after stopping the supply of power to the external device, an affirmation result is provided in step SP43. Thereby the central processing unit move the processing to step SP44. In this step, the central processing unit detects the residual amount of the battery B based on the data for voltage versus charge amount stored in the memory 13 as explained in the step SP23. The central processing unit updates the reference residual amount stored in the capacity register by the residual amount of battery power detected here.

When the supply of power is started after stopped the supply of power to the external device and When the predetermined time TW does not elapse, the central processing unit calculates the residual amount of battery power by the current integration method with reference to the residual amount of battery power stored in the capacity register. On the other hand after the predetermined time TW elapses, the central processing unit detects the residual amount of battery power by the voltage method with reference to the terminal voltage of no-load.

When the residual amount of battery power is detected by the voltage method, the central processing unit moves the processing to step SP45. After the central processing unit executes the correction processing of the full charge capacity done as same as the central processing unit 3 stated above about the configuration in the first embodiment, the processing moves to step SP46 to quit.

Although it is not shown in any flowchart, but the central processing unit confirms that the discharge current is 0 [A] in front and back of the step SP45 where the residual amount of battery power is detected by the voltage method. When the discharge current is not 0 [A], the processing returns to the step SP26, thereby when the discharge current starts to flow during the residual amount detection of battery power by the voltage method, the reference residual a:mount is not updated, and the degradation of residual amount detection precision is prevented.

(3) The Third Embodiment

Figure 5:
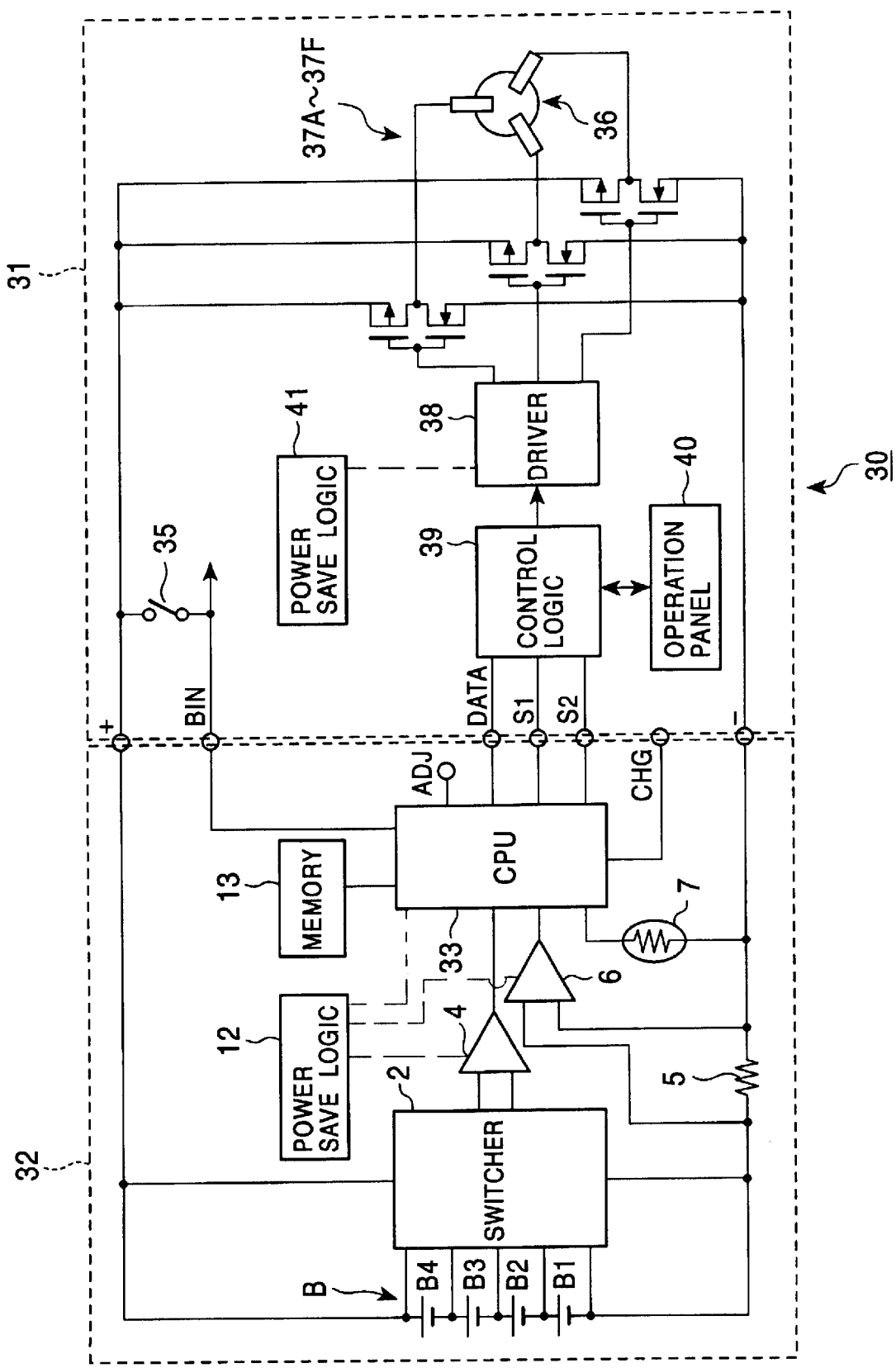
FIG. 5 is a block diagram showing an electric bicycle of the third embodiment of this invention.
Figure 6:
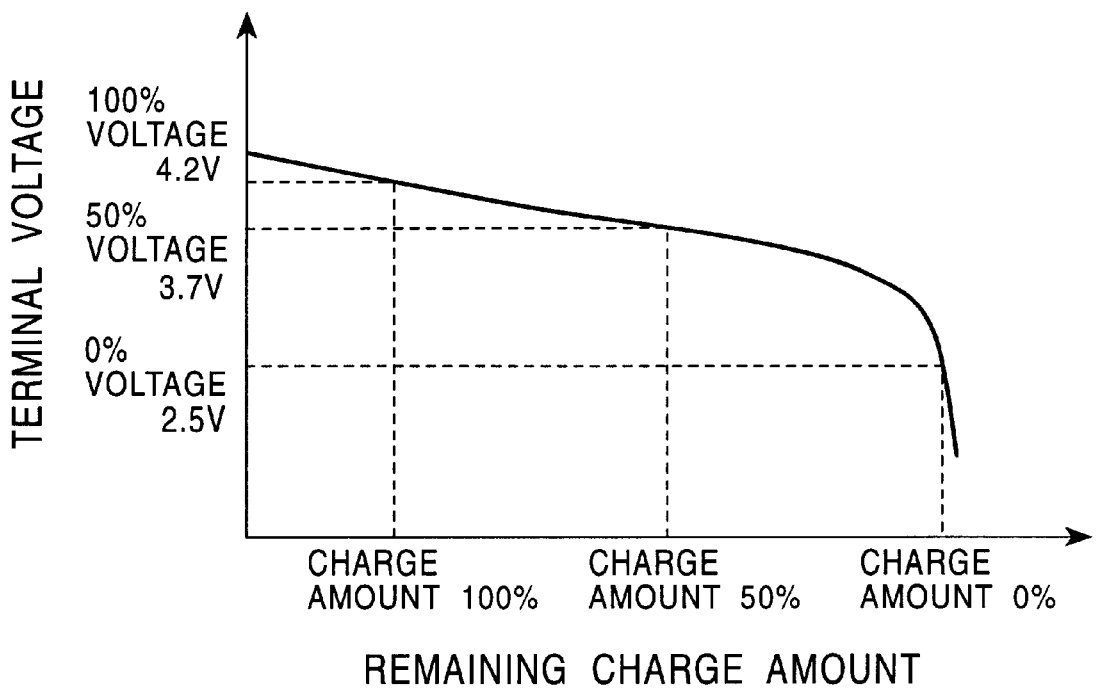
FIG. 6 is a characteristic curve showing a relation between the residual amount of battery power and the terminal voltage of the battery.

FIG. 5 is a block diagram showing an electric bicycle affecting configuration of the third embodiment of this invention. In a bicycle unit 31, a battery pack 32 is attached, and this electric bicycle 30 helps with an operation of a pedal by a user by the power of this battery pack 32.

The battery pack 32 controls charging and discharging here in lieu of the discharge control FET 9 and the charge control FET 10. On this account in the battery pack 32, the discharge control FET 9 and the charge control FET 10 are omitted as compared to the battery pack 1 stated in FIG. 2. In addition, a central processing unit 33 is arranged replacing with the central processing unit 3.

The central processing unlit 33 is done same as central processing unit stated above about configuration of the second embodiment here, and the residual amount of battery power is detected, and further charging and discharging of the battery B is controlled. In the control of charging and discharging of this battery B, the central processing unit 33 outputs a charge control signal S1 and a discharge control signal S2 to the bicycle unit 31 that is an external device land charging and discharging of battery B is controlled replacing with the control of charging and discharging by the control of the discharge control FET 9 and the charge control FET 10.

When the control terminal BIN is raised, the central processing unit 33 commands to start discharge to the bicycle unit 31 after the detection of the residual amount of battery power by the voltage method in status of no-load. On the contrary when the control terminal BIN goes down, the central processing unit 33 commands to stop discharge to the bicycle unit 31. During discharge to the bicycle unit 31, the central processing unit 33 detects the residual amount of battery power by the current integration method using the residual amount of battery power detected by the voltage method as reference residual amount. Further when the load current (discharge current) does not flow to the bicycle unit 31, the reference residual amount is updated by the residual amount of battery power detected by the voltage method at constant time interval. On the contrary when the control terminal BIN goes down and a predetermined interval elapsed, the central processing unit 33 detects the residual amount of battery power by the voltage method and updates reference residual amount.

The central processing unit 33 pulls up a charge terminal CHG to supply voltage during charging operation of the battery B, and thereby the charge apparatus is connected. In this case, a user can identify charging or discharging operation of the apparatus.

The bicycle unit 31 is so constructed that the control terminal BIN is connected to an input-output terminal+ through a power switch 35. Thereby the control terminal BIN is made high or low according to the operation of the power switch 35 by a user.

An electric three-phase motor 36 communicates driving force to a driving wheel of a bicycle through predetermined power communication mechanism, and so-called power assist is done to the operation of a pedal by a user. FETs (Field Effect Transistor) 37A~37 H are driven by a driver 38 of a three-phase inverter and drives the electric motor 36. The driver 38 drives the FETs 37A~37 H by the control of a control logic 39, thereby the electric motor 36 is driven by a predetermined rotational speed.

An operating section 40 is constituted by an operation control panel, a display and operation knobs and operation by a user is accepted and various information is offered to a user. A power save logic 41 stops the power supply to the driver 38, if necessary, thereby the power consumption of the battery B is reduced.

The control logic 39 is constituted by at least a central processing unit, and drives the driver 38 is driven according to a driving torque of a driving wheel detected through a torque detection in response to the operation of a user. Thereby the motor is driven when the operation of a pedal is heavy and within a predetermined speed range.

The control logic 39 executes this routine provided that the discharge of the battery B is permitted by the discharge control signal S1, and thereby the battery pack 312 stops the discharge when the residual amount of battery power is detected by the voltage method upon starting.

In addition, the control logic 39 communicates between the battery pack 32 through a data communication terminal DATA, and displays the residual amount of battery power detected at the battery pack 32 side on the display of the operating section 40.

Even if the residual amount of battery power is detected by the voltage method according to the construction as shown in FIG. 5 in accordance with the load control at the external device side, the effect same as configuration of the second embodiment is obtained. In addition the battery pack can be simplified by simplified control mechanism for the discharge current in the battery pack side.

(4) The Fourth Embodiment

When the residual amount of battery power is detected by the voltage method as described above in FIGS. 1, 3 and 4, the data for calibration are detected also in case of detecting the discharge current in this fourth embodiment.

In other words when the residual amount of battery power is detected by the voltage method, the central processing unit detects the terminal voltage of the battery cells B1~B4, provided that the discharge current is 0 [A]. Accordingly, the discharge current detected at this time shows errors in the discharge current detection caused by offset of the amplifier 6. A right detection result is obtained by subtracting these errors from the detection result of the discharge current.

Because of the above reason, the discharge current is detected in the residual amount detection by the voltage method in case of shipping from plant. Based on the detected result, the calibration data for the discharge current is stored in the memory 13 for updating. Thereby, the central processing unit updates the calibration data when the power is on and off.

As explained about update of full charge capacity using formula 1, erroneous correction for calibration data by dividing this correction value by the predetermined value in stead of processing for directly updating the calibration data with the detected correction value.

(5) The Other Embodiment

In the second embodiment, the time measurement is done about three kinds of time (TX, TY, TW)1 But in some case, these times TX, TY and TW are set to the same time. In this case the processing routine of the central processing unit can be simplified. Further in this case, in the construction where the power is automatically down when the interval where the load current is 0 [A] the timer can be used for measuring this interval.

In the above described embodiment, the residual amount of battery power is detected based on the discharge current by the current integration method. This invention is not limited to this, and the discharge current for monitoring overload may be used for detection of the residual amount of battery power by the current integration method. In this case it is applied to the system where the control of the load current and a step of the capacity calculation are synchronized and thereby processing routine can simplified.

In the configuration of the fourth embodiment as described above, the data for calibration is detected in the detection system of the discharge current simultaneously with the residual amount detection of battery power by the voltage method. This invention is not limited to this, and replacing or in addition to this, the data for calibration may be detected when the power supply is cut-off.

In addition, when the reference residual amount is detected by the voltage method in a case where the predetermined time when the discharge current is 0 [A] in the embodiment of above. But this invention is not limited to this, and if enough precision can be got in practical use, the reference residual amount can be updated by detecting the terminal voltage at the timing where the discharge current is 0 [A] without waiting for continuation of this fixed time in the case where the rising of the discharge current is small.

In addition in the embodiment as described above, the reference residual amount is detected by the voltage method at the time when the discharge current is 0 [A]. This invention is not limited to this, and if enough precision can be got in practical use, the reference residual amount can be updated based on the detected terminal voltage of roughly zero discharge current in stead of completely zero discharge current.

In addition, in the configuration of the embodiment above described, in a case of a rechargeable battery is described. This invention is not limited to this, and it can be applied broadly to the battery that is difficult to charging such as a dry battery.

In addition, this invention is applied to the battery apparatus such as the battery pack which supplies the power of battery to the external device. This invention is not limited to this, and this invention is applied to the external devices which receives the supply of power from the battery such as the personal computer apparatus and a portable telephone, and the residual amount of battery power may be detected in the external device side. In addition, this invention can be applied broadly to the battery powered apparatus which is installed a battery and works by the power of this battery.

In addition, in the configuration of the embodiment, in a case where the residual amount of battery power is changed in accordance with the discharge current is described. However, this invention is not limited to this, and it can be applied broadly to the case where the residual amount of battery power is changed in accordance with the charge current.

What is claimed is:

1. A battery control apparatus, comprising:
   charge detecting means for detecting change of charge of a battery based on current of the battery;
   first residual charge amount detecting means coupled to said charge detecting means for detecting a first residual charge amount of said battery by compensating a predetermined reference residual charge amount based on the detected result of said change of charge of the battery;
   second residual charge amount detecting means for detecting a second residual charge amount of said battery based on a terminal voltage of said battery; and
   reference residual charge amount updating means for updating said reference residual charge amount by detected result of said second residual charge amount of said battery, wherein
   said second residual charge amount of said battery is detected at a predetermined timing;
   whereby said predetermined timing is a predetermined duration that the battery current is zero or almost zero.

2. A battery control apparatus as claimed in claim 1, wherein
   said predetermined timing is the timing just before said current of the battery starts to flow.

3. A battery control apparatus as claimed in claim 1, wherein
   said reference residual charge amount updating means includes switching means for interrupting the current of said battery, and
   said predetermined timing is set in the period when said current of the battery is interrupted by said switching means.

4. A battery control apparatus as claimed in claim 1, wherein
   said battery control apparatus is connected to an external device as to form a path for said current between said external device, and
   said reference residual charge amount updating means generates said predetermined timing by designating the interruption of the current of the battery to the external device.

5. A battery control apparatus as claimed in claim 1, wherein
   said first residual charge amount detection means detects said first residual charge amount of said battery together with a rising of said battery current, and
   said reference residual charge amount is maintained at least during said predetermined time after the current of said battery goes down.

6. A battery control apparatus as claimed in claim 1, wherein
   said first residual charge amount detection means detects the residual charge amount of said battery together with a rising of the current of said battery, and
   said residual charge amount of said battery is detected by setting the residual charge amount detected at the time when said current of said battery is going down in the case where said current of said battery starts to flow within the time when said predetermined time does not elapse after said current of said battery is fallen down.

7. A battery control apparatus as claimed in claim 1 wherein
   said reference residual charge amount update means updates the reference residual charge amount by said charge detection result detected at a predetermined time interval in a case where said current of said battery is kept down after said predetermined time elapses from the time where current of said battery is fallen down.

8. A battery control apparatus as claimed in claim 1, wherein
   said battery control apparatus includes said battery, and
   said battery control apparatus is powered by said battery.

9. A battery control apparatus as claimed in claim 1, wherein
   said battery is detachably mounted on said battery control apparatus, and
   said battery control apparatus is powered by said battery.

10. A battery control apparatus as claimed in claim 1, wherein
    said battery control apparatus is connected to the external device for forming a current path there between.

11. A battery control apparatus as claimed in claim 1, wherein said current of said battery is charging current of said battery.

12. A battery control apparatus as claimed in claim 1, wherein said current of said battery is discharging current of said battery.

13. A management method for a battery, comprising the steps of detecting an intermediate residual charge amount of a battery based on a terminal voltage of said battery at a predetermined timing; and detecting a final residual charge amount of said battery based on current of said battery by setting said intermediate residual amount of the battery as a reference;

whereby said predetermined timing is a predetermined duration that the battery current is zero or almost zero.

* * * * *